United States Patent [19]

Ito et al.

[11] Patent Number: 5,001,668

[45] Date of Patent: Mar. 19, 1991

[54] NONVOLATILE MEMORY CIRCUIT DEVICE WITH LOW POWER CONSUMPTION AND WIDE OPERATING VOLTAGE RANGE

[75] Inventors: Makoto Ito, Yokohama; Nobutaka Kitagawa, Kawasaki, both of Japan

[73] Assignee: Kabushiki Kaisha Toshiba, Kawasaki, Japan

[21] Appl. No.: 319,205

[22] Filed: Mar. 6, 1989

[30] Foreign Application Priority Data

Mar. 9, 1988 [JP] Japan .................................. 63-55373

[51] Int. Cl.[5] ...................... G11C 7/00; G11C 11/34
[52] U.S. Cl. ............................. 365/189.09; 365/203; 365/185; 365/204
[58] Field of Search .............. 365/185, 189.09, 230.06, 365/205, 203, 226, 204

[56] References Cited

U.S. PATENT DOCUMENTS

| | | | |
|---|---|---|---|
| 3,980,899 | 9/1976 | Shimada et al. | 365/230.06 |
| 4,281,397 | 7/1981 | Neal et al. | 365/185 |
| 4,314,362 | 2/1982 | Klaas et al. | 365/205 |
| 4,394,748 | 7/1983 | Campbell, Jr. | |
| 4,644,501 | 2/1987 | Nagasawa | |
| 4,769,787 | 9/1988 | Furasawa et al. | 365/189.09 |
| 4,833,646 | 5/1989 | Turner | 365/185 |
| 4,843,594 | 6/1989 | Tanaka et al. | 365/185 |

FOREIGN PATENT DOCUMENTS

| | | | |
|---|---|---|---|
| 137933 | 10/1979 | Japan | 365/185 |
| 117787 | 7/1984 | Japan | 365/204 |

OTHER PUBLICATIONS

Yaron et al., "16KE²PROM with New Array Architecture", Electronic Engineering, vol. 54, No. 666, p. 35–47.

Maruyama et al., "Wide Operating Voltage Range and Low Power Consumption EPROM Structure for Consumer Oriented ASIC Applications," IEEE 1988 Custom Integrated Circuits Conference (Apr. 11, 1988, pp. 4.1.1–4.1.4).

Primary Examiner—Stuart N. Hecker
Assistant Examiner—Michael A. Whitfield
Attorney, Agent, or Firm—Finnegan, Henderson, Farabow, Garrett, and Dunner

[57] ABSTRACT

A column decoder is driven by an intermediate potential VDD from a circuit for generating an intermediate potential between a Vcc potential and a Vss potential, and a column selection output having a swing width of the intermediate potential is supplied to the gates of column selection transistors to limit a current flowing therethrough. In the data readout mode, a precharge potential generated from a dummy cell circuit acting as a reference potential generating circuit according to a precharging signal supplied thereto is compared with a logic level of "1" or "0" read out according to the memory content by means of a flip-flop acting as a sense amplifier, thus deriving a data readout output.

8 Claims, 5 Drawing Sheets

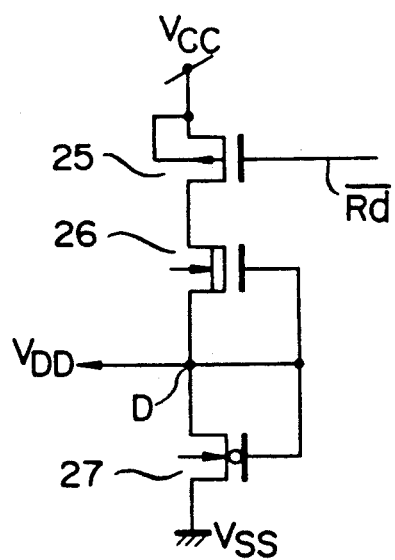
F I G. 7
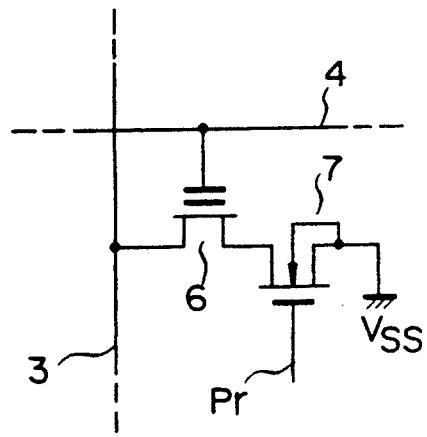
F I G. 8

NONVOLATILE MEMORY CIRCUIT DEVICE WITH LOW POWER CONSUMPTION AND WIDE OPERATING VOLTAGE RANGE

BACKGROUND OF THE INVENTION

1. Field of the Invention

This invention related to a nonvolatile memory circuit device having nonvolatile transistors as memory cells.

2. Description of the Related Art

As the memory cells of the nonvolatile memory circuit device have been miniaturized, it becomes highly possible that the memory cell will be damaged or data will be erroneously programmed when a power source voltage is applied to the drain of the memory cell as it is in the data readout mode. For this reason, it is required to suppress the drain voltage of the memory cell to a certain low voltage level during the data readout mode of the memory circuit of this type, and at the same time it is necessary to attain the highly reliable readout operation.

FIG. 1 is a circuit diagram showing the circuit construction of a conventional nonvolatile memory circuit device. To simplify the explanation, a data writing or programming circuit and the related circuits are omitted. As shown in FIG. 1, intermediate potential output circuit 30 for supplying a potential lower than potential Vcc is connected between positive power source potential terminal Vcc and node A. A plurality of column selection transistors 31 are commonly connected at one end to node A and respectively connected at the other end to bit lines 32. A plurality of word lines 33 are arranged to intersect bit lines 32, and memory cells 34 formed of nonvolatile transistors are arranged in respective positions in which the bit lines and word lines intersect each other. The drains of those memory cells which lie on the same column are connected to a corresponding one of bit lines 32 and the gates of those memory cells which lie on the same row are connected to a corresponding one of word lines 33. The sources of the memory cells are connected to ground potential terminal Vss. Further, sense amplifier 35 formed of a voltage comparator having an analog circuit structure is connected to node A. Reference potential Vref which is slightly lower than the output potential of intermediate potential output circuit 30 is supplied to sense amplifier 35 which in turn compares the potential at node A with reference potential Vref to output data Dout corresponding to the comparison result.

In a memory circuit of the above construction, the potential at node A is always kept at a potential level lower than power source potential Vcc by means of intermediate potential output circuit 30. As a result, the lower potential is supplied to the drain of a memory cell selected in the data readout mode, and therefore the above-described problems of damage of the memory cell and erroneous programming operation can be solved.

However, the amplitude of the potential at node A is limited by the presence of intermediate potential output circuit 30, and it is required to use a voltage comparator type sense amplifier with complicated analog circuit construction as sense amplifier 35. Such a sense amplifier has the disadvantages that the power source voltage margin is reduced, a low voltage operation is difficult and the current consumption is large.

Further, when memory cell 34 selected in the data readout mode is turned on, a D.C. penetration current flows between power source potential terminal Vcc and ground potential terminal Vss, further increasing the current consumption. In addition, intermediate potential output circuit 30 is required to have a large current capacity and consequently the circuit construction thereof becomes complex.

As described above, since, in the conventional nonvolatile memory circuit device, the potential to be detected by the sense amplifier is set at a low level to prevent damage of the memory cell and erroneous programming operation, there arise problems that it cannot be driven at a low voltage and the current consumption becomes large.

SUMMARY OF THE INVENTION

An object of this invention is to provide a nonvolatile memory circuit device which can be operated at a low voltage and with a reduced current consumption without lowering the operation reliability in the readout mode.

According to one aspect of this invention, there is provided a nonvolatile memory circuit device which comprises a memory cell array having a plurality of memory cells formed of nonvolatile transistors; a plurality of column lines connected to the drains of the memory cells; a plurality of column selection transistors respectively connected at one end to the column lines and commonly connected at the other end to a first node; a precharging transistor of a first conductivity type connected between a first potential terminal and the first node; a discharging transistor of a second conductivity type connected between a second potential terminal and the sources of the memory cells; a potential supplying circuit for selectively supplying a potential lower than the first potential at the first potential terminal to the gates of the column selection transistors according to address input; and a sense amplifier connected to the first node.

In the nonvolatile memory circuit device of this invention, a potential lower than the power source potential is supplied to the gates of the column selection transistors to suppress the drain potential of the memory cells to a low potential level. The potential supplying circuit for supplying the gate potential to the column selection transistors is used only to charge the gate capacity of the column selection transistors, and therefore the current capacity thereof can be reduced and the construction thereof can be simplified.

Further, in the nonvolatile memory circuit device of this invention, the first node to which the sense amplifier is connected is precharged to the power source potential by means of the precharging transistor, and the sources of the memory cells are discharged by means of the discharging transistor when a memory cell is selected. Therefore, no D.C. penetration current will flow and the current consumption can be reduced. In addition, since the first node to which the sense amplifier is connected is precharged to the first potential which is the power source potential, the amplitude of potential at the first node can be made sufficiently large. Thus, it becomes possible to constitute the sense amplifier connected to the first node by use of logic gate circuits. As a result, the power source voltage margin of the sense amplifier can be improved and the current consumption can be reduced.

BRIEF DESCRIPTION OF THE DRAWINGS

FIGS. 5 to 8 are circuit diagrams respectively showing the construction of portions of the circuits of FIGS. 2 and 3.

DETAILED DESCRIPTION OF THE PREFERRED EMBODIMENTS

There will now be described an embodiment of this invention with reference to the accompanying drawings.

Figure 1:
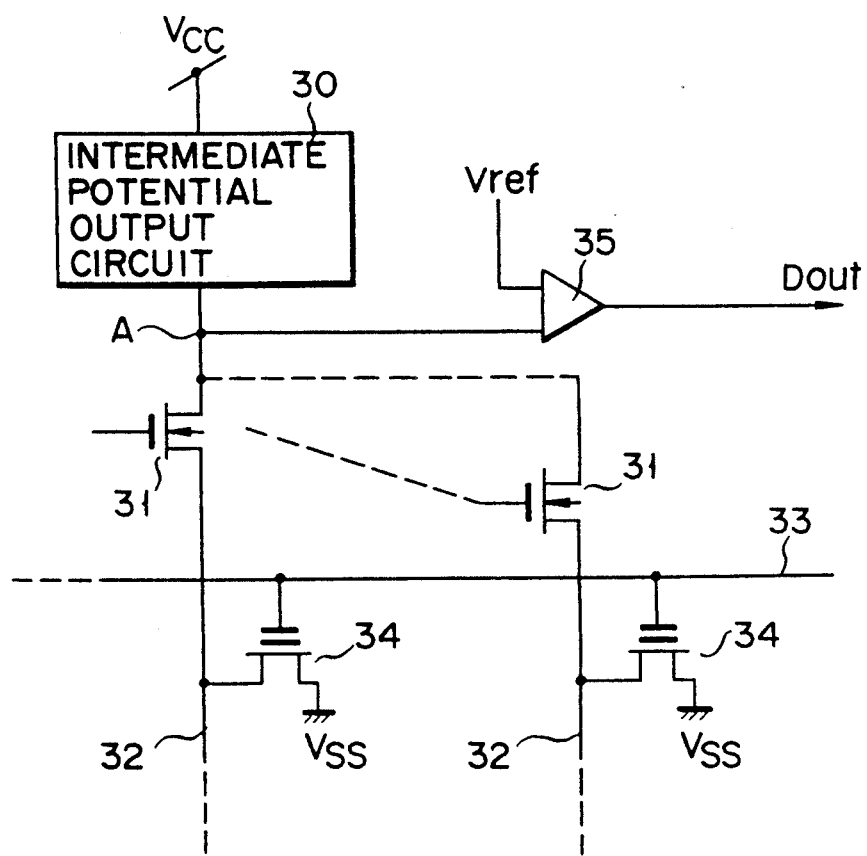
FIG. 1 is a block diagram showing the conventional nonvolatile memory circuit.
Figure 2:
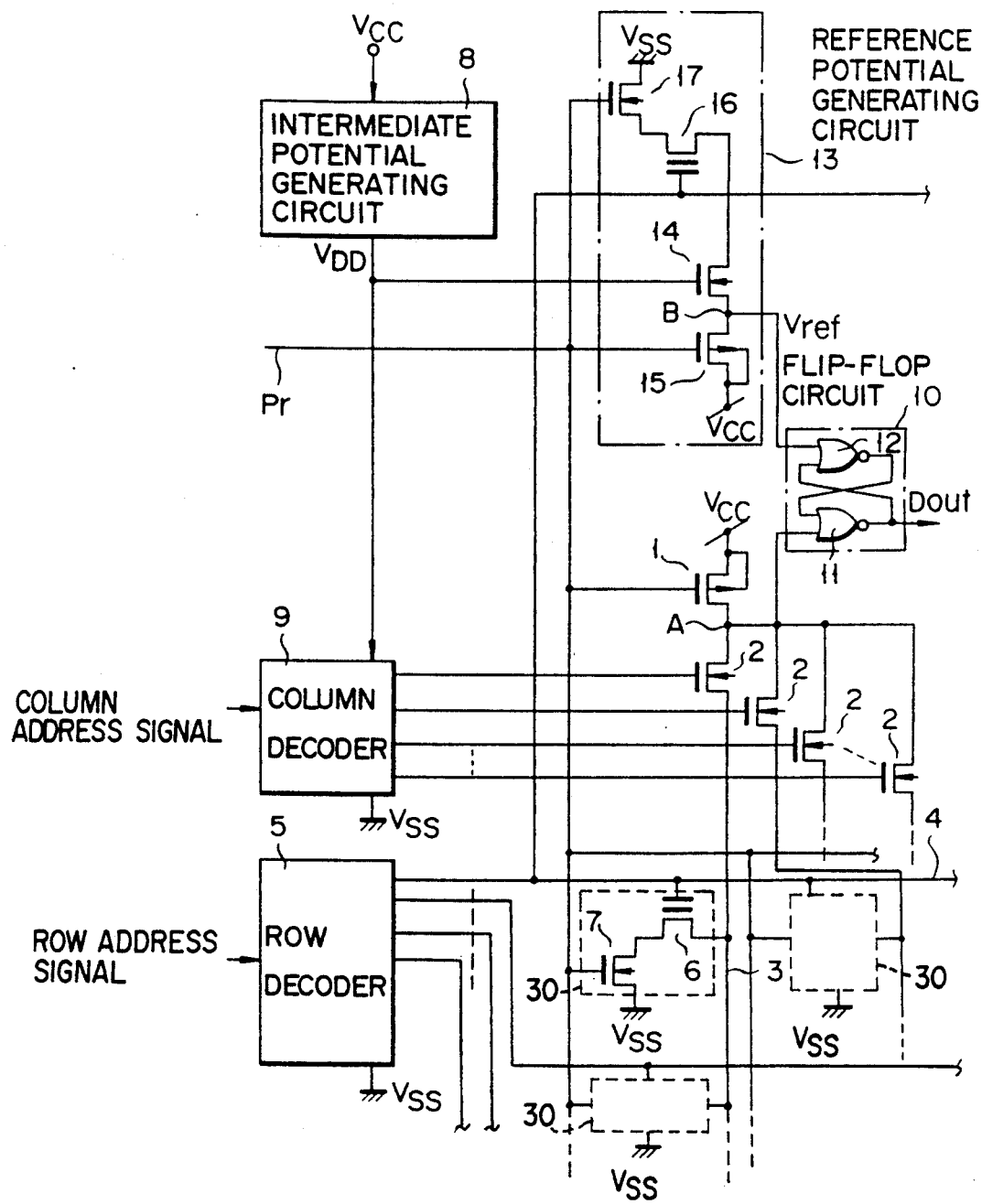
FIG. 2 is a block diagram showing a nonvolatile memory circuit device according to one embodiment of this invention.

FIG. 2 is a circuit diagram showing the construction of a nonvolatile memory circuit device according to one embodiment of this invention. To simplify the explanation, a programming circuit and the associated circuits are omitted. As shown in FIG. 2, a precharging transistor 1 formed of a P-channel MOS transistor is connected between positive power source potential terminal Vcc and a data detection node or node A. Precharging signal Pr is supplied to the gate of transistor 1. A plurality of column selection transistors 2 formed of N-channel MOS transistors are commonly connected at one end to node A, and are respectively connected at the other end to bit lines 3. A plurality of word lines 4 are arranged to intersect bit lines 3. Word lines 4 are selectively driven by the output of row decoder 5. Further, memory cells 6 formed of nonvolatile transistors having the floating gate structure are arranged in respective positions in which bit lines 3 and word lines 4 intersect. The drains of those of the memory cells which lie on the same column are connected to a corresponding one of bit lines 3 and the gates of those memory cells which lie on the same row are connected to a corresponding one of word lines 4. The sources of memory cells 6 are commonly connected to the drain of discharging transistor 7 formed of an N-channel MOS transistor. The source of discharging transistor 7 is connected to ground potential terminal Vss.

Constant potential VDD which is lower than power source potential Vcc and higher than ground potential Vss is supplied from intermediate potential generating circuit 8. Potential VDD is supplied to column decoder 9 to which a column address signal is also supplied. Column decoder 9 selectively supplies potential VDD to the gates of column selection transistors 2 according to the received column address signal.

Sense amplifier 10 is connected to node A. Sense amplifier 10 is constituted by a flip-flop circuit including two CMOS NOR gate circuits 11 and 12 whose input and output terminals are cross-coupled. The potential at node A is supplied to NOR gate circuit 11 and comparison voltage Vref generated from reference potential generating circuit 13 is supplied to NOR gate circuit 12.

Reference potential generating circuit 13 includes transistor 14 which is formed to be equivalent to column selection transistor 2 and whose gate is supplied with a potential equal to constant potential VDD in the memory cell selecting operation, transistor 15 which is formed to be equivalent to precharging transistor 1 and whose gate is supplied with precharge signal Pr, dummy cell 16 having a similar nonvolatile transistor structure to that of memory cell 6 and formed to have a source-drain current half that of memory cell 6, and transistor 17 connected between dummy cell 16 and ground potential terminal Vss, formed to be equivalent to discharging transistor 7, and having a gate supplied with precharging signal Pr.

Figure 4:
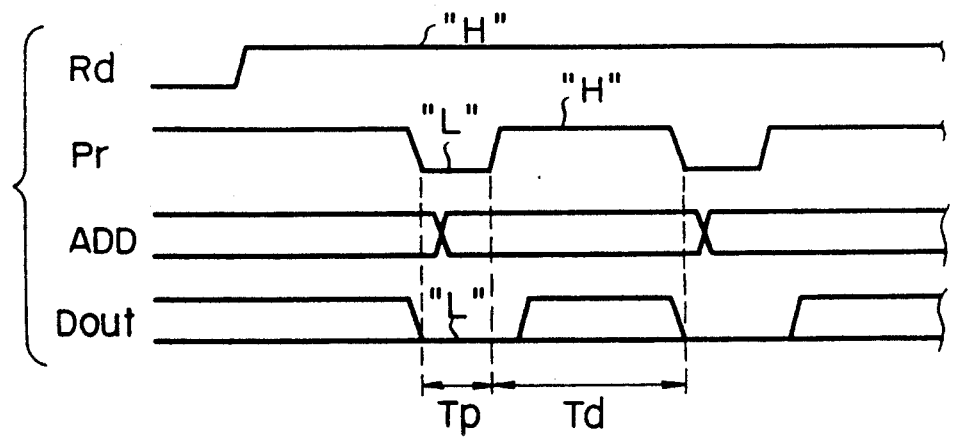
FIG. 4 is a timing chart for illustrating the operation the circuits shown in FIGS. 2 and 3.

The data readout operation in the memory circuit of the above-described construction is explained with reference to the timing chart shown in FIG. 4. First, precharge signal Pr is set to "L" level to turn on precharging transistor 1 after readout control signal Rd is set to and kept at "H" level. As a result, node A is precharged to power source potential Vcc (precharging period Tp). At this time, discharging transistor 7 is turned off to prevent a D.C. penetration current from flowing between power source potential terminal Vcc and ground potential terminal Vss. Further, transistors 15 and 17 of reference potential generating circuit 13 are respectively turned on and off, thereby causing node B connected to sense amplifier 10 to be precharged to Vcc level. Since, in this case, both nodes A and B are precharged to Vcc level or "H" level, output data Dout of sense amplifier 10 is set to "L" level.

Next, column and row addresses ADD are respectively supplied to column decoder 9 and row decoder 5, and then precharge signal Pr is changed form "L" to "H" level. Precharge signal Pr of "H" level renders transistor 7 conductive to start the data readout period (discharging period Td). Turn-on of transistor 7 causes the sources of memory cells 6 to be set to the ground potential. At the same time, one of column selection transistors 2 is selected by column decoder 9 according to the column address signal, and constant potential VDD from intermediate potential generating circuit 8 is supplied to the gate of selected transistor 2. As the result of this, selected transistor 2 is turned on. However, since the gate potential of selected transistor 2 is lower than power source potential Vcc, a potential lower than power source potential Vcc will be supplied to that one of bit lines 3 which is connected to an activated one of column selection transistors 2. On the other hand, one of word lines 4 is selected by row decoder 5 according to the row address signal. Then, a driving signal of "H" level is supplied to those gates of memory cells 6 which are connected to selected word line 4. As a result, a memory cell lying in the intersecting position between the selected word line and the bit line to which a potential lower than power source potential Vcc is supplied is selected. Assuming now that the selected memory cell has been programmed to have a lower threshold voltage, then the selected memory cell is turned on and bit line 3 and node A are discharged to ground potential Vss. In contrast, if the selected memory cell has been programmed to have a higher threshold voltage, the selected memory cell is turned off and neither bit line 3 nor node A is discharged.

When precharge signal Pr is changed from "L" level to "H" level, transistor 17 of reference potential generating circuit 13 is turned on. Further, when one of column selection transistors 2 is selected, intermediate potential VDD is supplied to the gate of transistor 14. As a result, node B is discharged from power source potential level Vcc. Assume now that the threshold voltage of selected memory cell 6 is low and node A is also discharged. Then, since the source-drain current of dummy cell 16 of reference potential generating circuit 13 is set to be substantially half that of memory cell 6, the potential at node A approaches Vss more rapidly than that at node B. As a result, output data Dout of sense amplifier 10 is inverted from "L" level to "H" level. In contrast, if the threshold voltage of selected memory cell 6 is high, node A is not discharged and node B is discharged so that output data Dout will be kept unchanged and remain at "L" level. In this way, data can be read out from the selected memory cell.

Since a potential lower than power source potential Vcc is applied to bit line 3, damage of the memory cell and erroneous programming operation occurring in the prior art case can be prevented.

Node A is precharged to the power source potential via transistor 1 in the data readout period, and then the source of each memory cell 6 is discharged to the ground potential via transistor 7 so that a D.C. penetration current can be prevented from flowing between the power source potential terminal and the ground potential terminal. Thus, the current consumption can be reduced.

Further, since intermediate potential generating circuit 8 for generating a potential lower than the power source potential is required only to drive the gate of column selection transistor 2, the current capacity thereof can be made small, the current consumption can be reduced and the construction can be simplified.

In addition, since the potential at node A varies between power source potential Vcc and ground potential Vss, sense amplifier 10 can be formed of a logic gate circuit which is constructed by NOR gate circuits 11 and 12 in a simple construction as shown in FIG. 2, and thus the current consumption can be reduced. In this case, if NOR gate circuits 11 and 12 are formed in the CMOS form, the current consumption can be further reduced. Thus, the use of the logic circuit which is constructed in a flip-flop form makes it possible to attain stable circuit operation over a wide voltage range, low power consumption and the low voltage operation.

Figure 3:
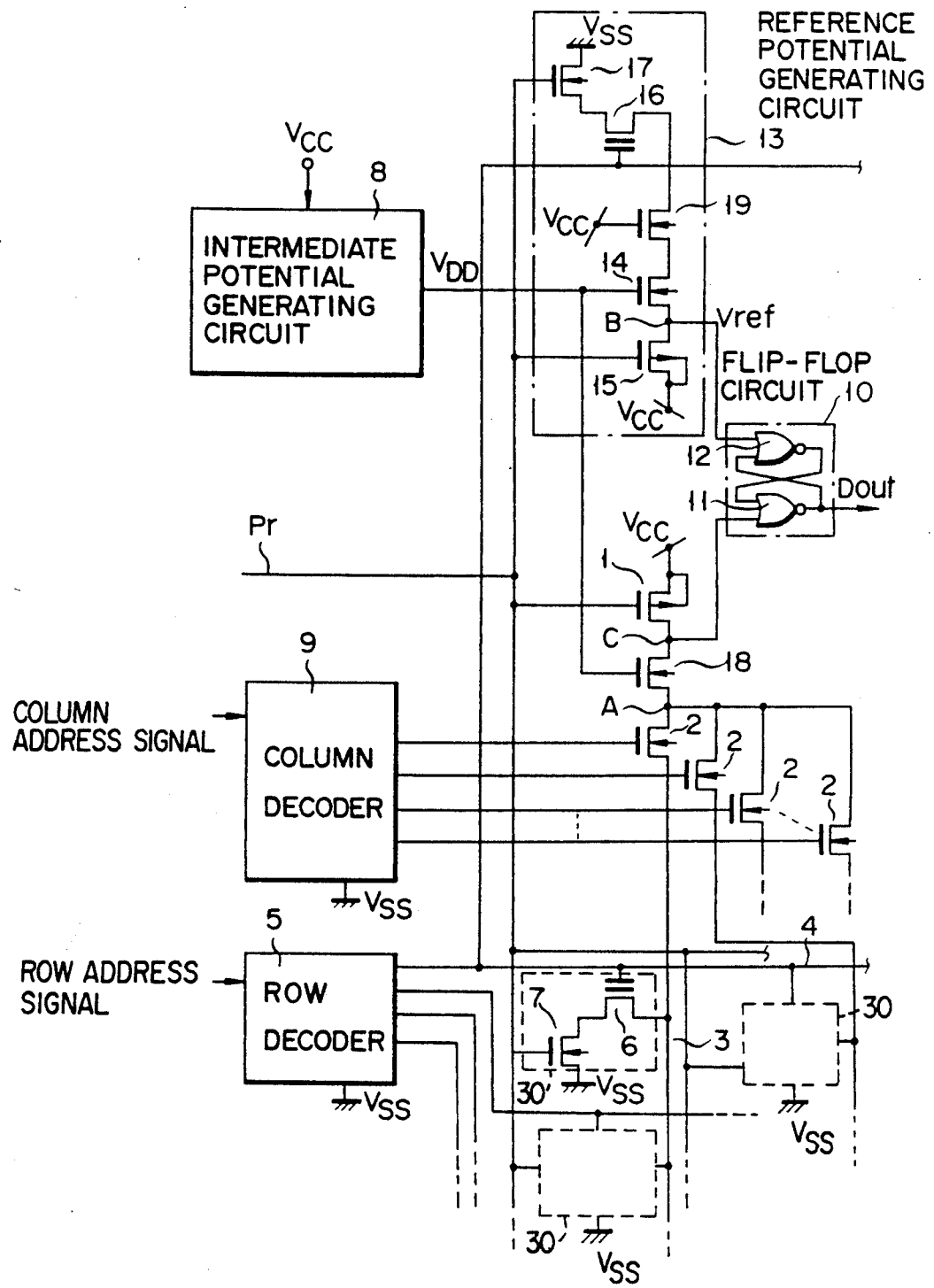
FIG. 3 is a block diagram showing a nonvolatile memory circuit device according to another embodiment of this invention.

FIG. 3 is a circuit diagram showing the construction of a nonvolatile memory circuit device according to another embodiment of this invention. In the circuit of this embodiment, level-down transistor 18 whose gate is supplied with intermediate potential VDD is connected between node A or the commonly connected node of a plurality of column selection transistors 2 and one end of precharging transistor 1 which is connected at the other end to first potential terminal Vcc. With this construction, a potential lower than the first potential or power source potential Vcc is selectively supplied to bit line 3 via column selection transistor 2. Further, transistor 19 which is formed to be equivalent to transistor 2 and whose gate is supplied with power source potential Vcc is connected between dummy cell 16 and transistor 14 in reference potential generating circuit 13. The potential at connection node C between precharging transistor 1 and level-down transistor 18 is supplied to NOR gate circuit 11 of sense amplifier 10.

The data readout operation of the circuit device of FIG. 3 is effected in the same manner as explained with reference to the timing chart of FIG. 4. In addition, the circuit device of FIG. 3 is excellent in its integration density. That is, in the circuit device of FIG. 2, intermediate potential VDD is supplied to column decoder 9. Therefore, it is necessary to provide buffers (not shown) formed of CMOS circuits, for example, in column decoder 9 in order to supply a potential lower than the first potential or power source potential Vcc to the gate of each column selection transistor 2. As a result, the pattern area tends to increase. In contrast, in the circuit device of FIG. 3, it is only necessary to use one level-down transistor 18 for a plurality of column selection transistors, and therefore an increase in the pattern area can be made smaller in comparison with the case wherein a large number of buffers are used as described above.

Since the capacitance and resistance of the column decoder increase with an increase in the memory capacity, the operation reliability can be more enhanced if the number of circuits such as the above-described buffers which may cause a delay time can be reduced.

Figure 5:
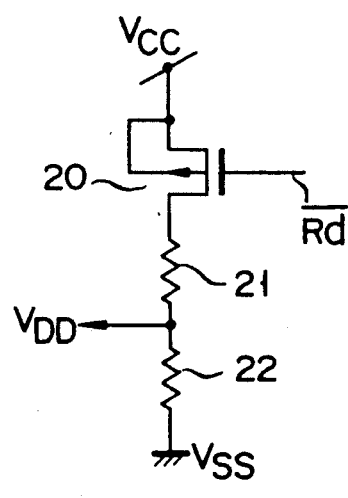
Figure 6:
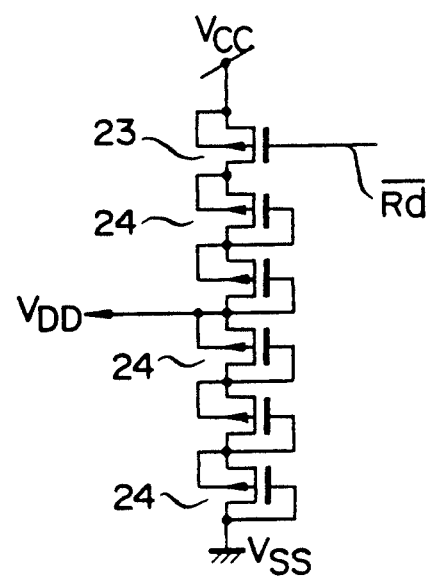

FIGS. 5, 6 and 7 are circuit diagrams showing the detailed construction of intermediate potential generating circuit 8 which can be used in the circuit of the above embodiments.

In the circuit of FIG. 5, P-channel MOS transistor or switching transistor 20 and two resistors 21 and 22 are serially connected between power source potential terminal Vcc and ground potential terminal Vss. In this case, the conduction state of switching transistor 20 is controlled by, for example, signal $\overline{Rd}$ which takes an inverted form of readout control signal Rd and is set to "L" level in the data readout mode. With the circuit of FIG. 5, transistor 20 is kept in the off state in a period other than the data readout period, and therefore no current consumption occurs. In contrast, in the data readout mode, transistor 20 is turned on to derive potential VDD which is obtained by dividing potential Vcc by resistors 21 and 22 and is thus lower than potential Vcc.

In the circuit of FIG. 6, P-channel MOS transistor or switching transistor 23 and a plurality of P-channel MOS transistor 24 are serially connected between power source potential terminal Vcc and ground potential terminal Vss. In this case, the conduction state of switching transistor 23 is controlled by signal $\overline{Rd}$. Also, in this circuit, transistor 23 is kept in the off state in a period other than the data readout period, and therefore no current consumption occurs. In contrast, in the data readout mode, transistor 23 is turned on to derive potential VDD which is obtained by dividing potential Vcc by the resistances of switching transistor 23 and a plurality of transistors 24 and is thus lower than potential Vcc.

In the circuit of FIG. 7, P-channel MOS transistor or switching transistor 25, N-channel MOS transistor 26 of depletion type and N-channel MOS transistor 27 of intrinsic type (having a threshold voltage of about 0 V) are serially connected between power source potential terminal Vcc and ground potential terminal Vss. In this case, the gates of transistors 26 and 27 and a connection node therebetween are connected together to make output node D and the conduction state of switching transistor 25 is controlled by signal $\overline{Rd}$. With the circuit of FIG. 7, transistor 25 is kept in the off state in a period other than the data readout period, and therefore no current consumption occurs. In contrast, in the data readout mode, transistor 25 is turned on so that voltage VDD which is obtained by dividing the drain voltage of switching transistor 25 by ON-resistances of transistors 26 and 27 is thus lower than voltage Vcc can be derived out via output node D. With this construction, since the gates of transistors 26 and 27 and node D are connected together, a constant intermediate potential can always be obtained even if power source potential $V_{cc}$ has varied to some extent.

This invention is not limited to the above-described embodiments, and can be variously modified within the technical scope thereof. For example, it is possible to commonly connect the sources of the memory cells to discharging transistor 7 so that it can be used commonly for all the memory cells connected to one bit line. It is also possible to individually use discharging transistor 7 for each memory cell 6 in such a manner as shown in FIG. 8. Further, intermediate potential generating circuit 8 and sense amplifier 10 are not limited to those shown in the drawings, but can be variously modified.

As described above, according to this invention, a nonvolatile memory circuit device can be provided in which the circuit construction can be simplified without lowering the operation reliability in the readout mode and which can be operated at a low voltage and with a small power consumption.

What is claimed is:

1. A nonvolatile memory circuit device comprising:
   a memory cell array having a plurality of memory cells formed of nonvolatile transistors;
   a plurality of column lines connected to drains of said memory cells;
   a plurality of column selection transistors respectively connected at one end to said column lines and commonly connected at the other end to a first node;
   a precharging transistor of a first conductivity type operated by a precharge signal, and connected between a first potential terminal and said first node;
   at least one discharging transistor of a second conductivity type connected between a second potential terminal and sources of said memory cells, said discharging transistor being operated by the precharge signal;
   potential supplying means for selectively supplying a potential lower than the first potential at said first potential terminal to gates of said column selection transistors according to address input; and
   a sense amplifier connected to said first node.

2. A nonvolatile memory circuit device according to claim 1, wherein said sense amplifier includes a flip-flop formed of a CMOS logic gate circuit for comparing the potential at said fist node with a reference potential.

3. A nonvolatile memory circuit device according to claim 1, wherein said device further comprises a power source terminal, and said potential supplying means includes a constant potential circuit for delivering said potential held at a constant value irrespective of a variation of an output voltage at said power source terminal.

4. A nonvolatile memory circuit device comprising:
   a memory cell array having a plurality of memory cells formed of nonvolatile transistors;
   a plurality of column lines connected to drains of said memory cells;
   a plurality of column selection transistors respectively connected at one end to said column lines and commonly connected at the other end to a first node;
   a precharging transistor of a first conductivity type operated by a precharge signal, and connected between a first potential terminal and a second node;
   at least one discharging transistor of a second conductivity type connected between a second potential terminal and sources of said memory cells, said discharging transistor being operated by the precharge signal;
   a level-down transistor of the second conductivity type which is connected between said first and second nodes and whose gate is supplied with a potential lower than the potential at said first potential terminal in the data readout mode; and
   a sense amplifier connected to said second node.

5. A nonvolatile memory circuit device according to claim 4, wherein said sense amplifier includes comparator means having a flip-flop formed of a CMOS logic gate circuit for comparing the potential at said second node with a reference potential.

6. A nonvolatile memory circuit device according to claim 4, wherein said device further comprises a power source terminal and a potential supplying means connected to said power source terminal, said potential supplying means supplying said potential held at a constant value irrespective of a variation of an output voltage at said power source terminal.

7. A nonvolatile memory circuit device comprising:
   a memory cell array having a plurality of memory cells formed of nonvolatile transistors;
   a plurality of column lines connected to drains of said memory cells;
   a plurality of column selection transistors respectively connected at one end to said column lines and commonly connected at the other end to a first node;
   a precharging transistor of a first conductivity type, which is turned on by a precharge signal to increase the potential of a bit line connected to each memory cell to a predetermined potential level, connected between a first potential terminal and said first node;
   at least one discharging transistor of a second conductivity type, which is turned off by said precharge signal to discharge said potential of said bit line, connected between a second potential terminal and sources of said memory cells;
   potential supplying means for selectively supplying a potential lower than the first potential at said first potential terminal to gates of said column selection transistors according to address input; and
   a sense amplifier connected to said first node.

8. A nonvolatile memory circuit device comprising:
   a memory cell array having a plurality of memory cells formed of nonvolatile transistors;
   a plurality of column lines connected to drains of said memory cells;
   a plurality of column selection transistors respectively connected at one end to said column lines and commonly connected at the other end to a first node;
   a precharging transistor of a first conductivity type, which is turned on by a precharge signal to increase the potential of a bit line connected to each memory cell to a predetermined potential level, connected between a first potential terminal and a second node;
   at least one discharging transistor of a second conductivity type, which is turned off by said precharge signal to discharge said potential of said bit line, connected between a second potential terminal and sources of said memory cells;
   a level-down transistor of the second conductivity type which is connected between said first and second nodes and whose gate is supplied with a potential lower than the potential at said first potential terminal in the data readout mode; and
   a sense amplifier connected to said second node.

* * * * *